United States Patent [19]
Kozol et al.

[11] Patent Number: 6,021,904
[45] Date of Patent: Feb. 8, 2000

[54] CHIP CARRIER PROCESSING AND SHIPPING ARRAY AND METHOD OF MANUFACTURE THEREOF

[75] Inventors: John E. Kozol, Binghamton; Duane A. Stanke, Maine; Son Kim Tran, Endwell, all of N.Y.

[73] Assignee: International Business Machines Corporation, Armonk, N.Y.

[21] Appl. No.: 09/327,939

[22] Filed: Jun. 8, 1999

[51] Int. Cl.⁷ .................................................. B65D 85/86
[52] U.S. Cl. ............................ 206/724; 53/473; 206/813
[58] Field of Search ............................ 53/443, 467, 472, 53/473; 206/701, 713, 714, 716, 722, 724, 813

[56] References Cited

U.S. PATENT DOCUMENTS

| | | |
|---|---|---|
| 4,718,548 | 1/1988 | Estrada et al. ............................ 206/724 |
| 4,881,639 | 11/1989 | Matsuoka et al. . |
| 5,026,303 | 6/1991 | Matsuoka et al. . |
| 5,324,569 | 6/1994 | Nagesh et al. . |
| 5,358,590 | 10/1994 | Yamanaka . |
| 5,547,082 | 8/1996 | Royer et al. . |
| 5,636,745 | 6/1997 | Crisp et al. . |
| 5,662,262 | 9/1997 | McMahon et al. . |
| 5,789,307 | 8/1998 | Igel et al. . |
| 5,791,484 | 8/1998 | Ikeda et al. . |
| 5,833,073 | 11/1998 | Schatz et al. ............................ 206/724 |

*Primary Examiner*—Jacob K. Ackun
*Attorney, Agent, or Firm*—Scully, Scott, Murphy & Presser

[57] ABSTRACT

A chip carrier which is employed in the industry for mounting integrated circuits and various types of electronic components on chips and is adapted to be positioned within a processing tray or carrier frame for shipping and processing purposes, and wherein the chip carrier is adapted to be precisely positioned and adhesively maintained in a fixed relationships in the carrier frame. Also disclosed is a method of manufacturing chip carrier arrays or strips which are adapted to be positioned in predetermined adhesively fixed relationships within a carrier frame or tray for processing and shipping purposes.

24 Claims, 3 Drawing Sheets

CHIP CARRIER PROCESSING AND SHIPPING ARRAY AND METHOD OF MANUFACTURE THEREOF

BACKGROUND OF THE INVENTION

The present invention relates to a chip carrier which is employed in the industry for mounting integrated circuits and various types of electronic components on chips and is adapted to be positioned within a processing tray or carrier frame for shipping and processing purposes, and wherein the chip carrier is adapted to be precisely positioned and maintained in a fixed relationships in the carrier frame. Moreover, the invention is directed to a method of manufacturing chip carrier arrays or strips which are adapted to be positioned in predetermined fixed relationships within a carrier frame or tray for processing and shipping purposes.

DISCUSSION OF THE PRIOR ART

The mechanical aspects of positioning and fastening chip carriers in chip carrier frames or processing trays to facilitate the processing and shipping of the chip carriers is well-developed in the technology. However, difficulties have been encountered in being able through the use of simple means to accurately position and retain chip carriers in chip carrier frames or processing trays which are employed for chip carrier processing and shipping purposes.

Ikeda, et al., U.S. Pat. No. 5,791,484 discloses an assembly of chip components which are adapted to be interconnected through the intermediary of a continuous tape arrangement in order to enable the positioning of the components for processing and shipping purposes. However, although the patent discloses the use of strip like releasable connecting material including adhesive resins, which connects a chip assembly to a further chip assembly, the necessary precise and rigidly fixed positioning of chip carriers in a carrier frame arrangement is not provided for with this patent.

Igel, et al., U.S. Pat. No. 5,789,307 discloses a method of separating electronic devices which are contained or arranged in a carrier, wherein separation of chip carrier assemblies is implemented through the intermediary of chemicals. There is no disclosure of providing a frame structure adhesively positioning and fastening chip carriers therein in a precise and accurately fixed mode in order to facilitate processing and shipping of the chip carriers.

Crisp, et al., U.S. Pat. No. 5,636,745 discloses a tray structure for the support of a component, including an apparatus for accurately positioning integrated circuit components for subsequent processing and shipping. However, the mechanical structure utilized in this patent only enables the components to be resiliently positioned and retained in the tray structure so as to inhibit the accurately fixed retention of the components during processing and shipping, while also covering or obscuring component surface areas which would normally be utilized for mounting integrated circuit arrangements.

Royer, et al., U.S. Pat. No. 5,547,082, discloses a component tray structure having removable inserts in which a tray having removable chip carrier type inserts in close proximity but not quite in contact with each other. There is no disclosure of any rigidly positioned and adhesive connection between chip carriers and a carrier frame which would allow for unhindered access to the entire surface areas of the chip carriers so as to facilitate the mounting of electronic components thereon.

Yamanaka, U.S. Pat. No. 5,358,590, discloses a method of manufacturing individual element arrays, wherein the individual electronic arrays are adapted to be separated from each other through the intermediary of a sawing or cutting tool. There is no provision of any structure or method enabling any chip or component carrier to be fixedly mounted or retained within a carrier frame which will facilitate unhindered access to the entire surface areas of the chip carrier or plurality of arrayed carriers.

Matsuoka, et al., U.S. Pat. Nos. 5,026,303 and 4,881,639 each disclose integrated circuit chip carriers and slotless-type IC carrier constructions, wherein each chip carrier is provided with apertures or depressions at each corner of the chip carrier. The depressions enable the engagement thereof through the intermediary of clip elements which are fastened to a chip carrier frame. However, this type of attachment only facilitates a relatively resilient positioning of the chip carriers in a frame, but does not enable the precisely fixed rigid mounting of the chip carriers in the chip carrier frame to allow for a precision processing and shipping thereof.

SUMMARY OF THE INVENTION

Accordingly, in order to be able to obviate the disadvantages and drawbacks encountered in presently employed chip carrier processing and shipping systems, particularly when it is intended to fixedly mount chip carriers in a chip carrier frame structure so as to facilitate the precise processing and shipping thereof while providing unobstructed access to the surface areas of the chip carrier, the invention provides for a chip carrier processing and shipping array structure which facilitates mechanically and adhesively fastening chip carrier components in a chip carrier frame arrangement. In this connection, the chip carrier frame arrangement includes central through-extending openings into which the chip carriers are positioned, with the openings being slightly larger than the peripheral dimensions of the chip carrier; and with the corners or at suitable locations about the openings in the frame structure, there are provided spot-faced recesses or lands proximate the adjacent edges of the chip carriers. Thereafter, a small amount of adhesive is dispensed onto the recessed upper surfaces of the spot-faced lands in the chip carrier frame opening and the assembled elements subjected to a thermal curing process for the adhesive. This curing process causes the adhesive to flow towards and between the facing edge portions of the respective chip carrier and the recessed lands without flowing beneath the chip carrier. Consequently, upon the curing of the adhesive so as to impart a solid and essentially rigid consistency thereto, the resultant adhesive interconnection between the elements provides for a fixed and accurate positioning of the chip carrier, or array of chip carriers, in the carrier frame or array of chip carrier frames, with the necessary pitch spacing and tooling holes for a die attach process as is known in the technology. Inasmuch as the frame array is of identical thickness with the chip carrier or carriers, all points or locations on the top and bottom surfaces of the chip carrier or carriers are accessible. This provides an excellent mode of being to process integrated circuits on both surfaces of the chip carrier without any loss of valuable working surface areas or so-called "real estate", thereby maximizing the benefits of the inventive arrangement and method, and with practically no waste of time or material in the processing of the foregoing chip carriers since only the edge portions or corners of the chip carriers are retained by the carrier frame.

Accordingly, it is an object of the present invention to provide a method of manufacturing chip carriers which are adapted to be processed and shipped while fixedly and accurately mounted in a chip carrier frame construction.

Another object of the present invention is to provide a method of manufacturing laminate chip carrier strips which are mounted in chip carrier frame arrays through the intermediary of curable adhesives which interconnect the chip carriers to the frame by being interposed at peripherally spaced edge locations extending between the components.

Yet another object of the present invention resides in the provision of a chip carrier which is adapted to be adhesively fastened in a chip carrier frame construction through the intermediary of a curable adhesive.

A still further object of the present invention resides in the provision of a laminated chip carrier array which is adapted to be adhesively fastened in a chip carrier frame arrangement through the intermediary of a curable adhesive composition which is adopted to contact the chip carrier frame and adjacent corner or edge portions of the chip carrier without flowing onto the surfaces of the chip carrier.

BRIEF DESCRIPTION OF THE DRAWINGS

Reference may now be had to the following detailed description of a preferred embodiment of the invention, taken in conjunction with the accompanying drawings; in which.

DETAILED DESCRIPTION OF A PREFERRED EMBODIMENT

Figure 1:
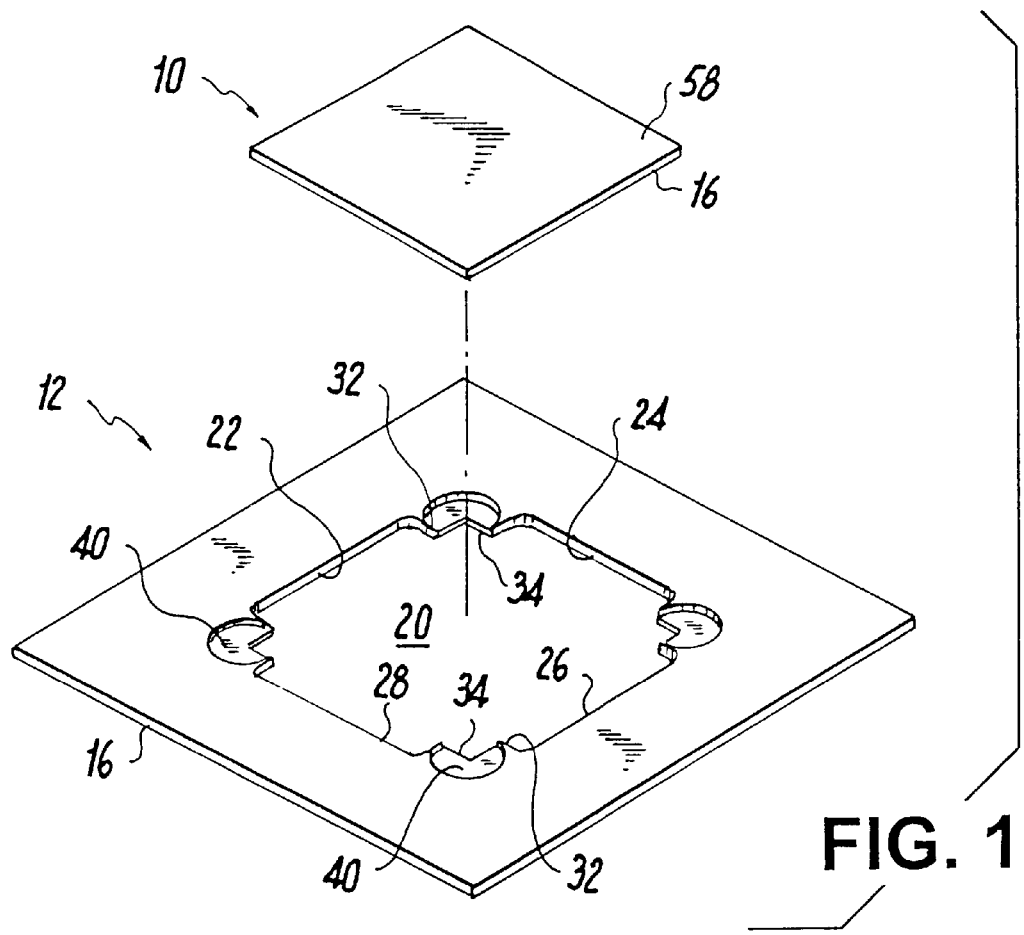
FIG. 1 illustrates a perspective exploded view of a chip carrier and chip carrier frame construction pursuant to the invention.

Referring now in detail to the drawings, and particularly FIG. 1, there is illustrated a laminate chip carrier 10 which is to be processed and shipped for the positioning thereon of electronic components and/or integrated circuits (not shown), as is well-known in the electronics technology. In this particular exemplary embodiment, the chip carrier 10 has an essentially rectangular or square shape of uniform thickness, having been cut from a larger sized panel format, and which has been singulated into an individual component or piece so as to be able to be assembled into a potential strip or array of individual or discrete chip carriers. Although the square shape may be a preferred embodiment, other shapes such as; for example, oval, round, triangular or polygonal, readily lend themselves to the invention.

The chip carrier 10 is essentially of a flat or planar configuration on opposite sides thereof, and is of a predetermined thickness, and may be a laminate material.

Figure 5:
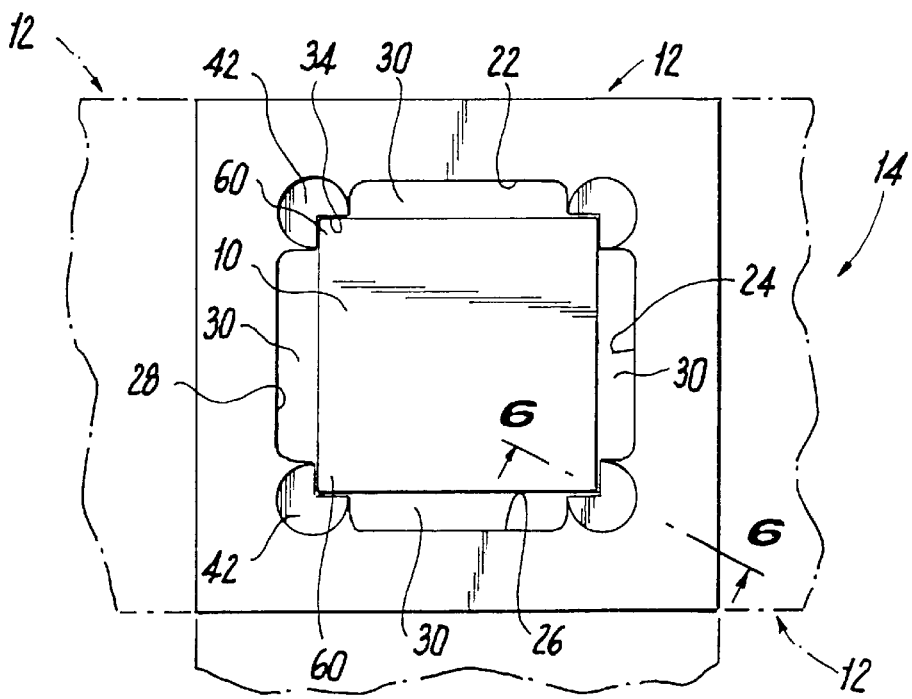
FIG. 5 illustrates a top plan view of the assembled chip carrier and chip carrier frame as shown in FIG. 2.

In order to prepare and mount the laminate chip carrier 10 for chip processing and transportation or shipping, there is provided a chip carrier frame 12 pursuant to the invention, which may comprise either a single frame, as illustrated in FIG. 1 of the drawings, or referring to FIG. 5, where there is schematically illustrated an assembly 14 in which a plurality of chip carrier frames 12 may be formed in a strip or, as may be required, in an array for the processing and shipping of a plurality of chip carriers.

Figure 2:
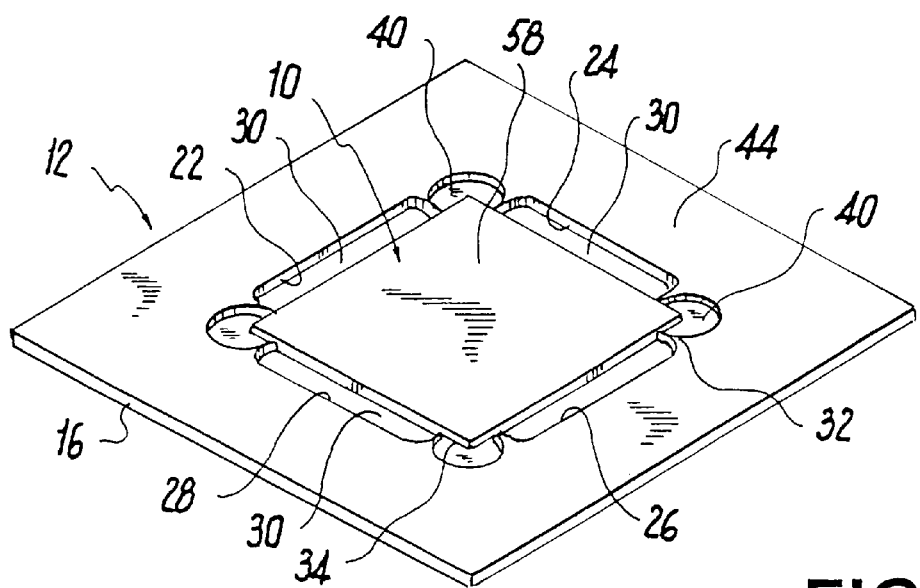
FIG. 2 illustrates a perspective view of the chip carrier as arranged in the chip carrier frame.
Figure 3:
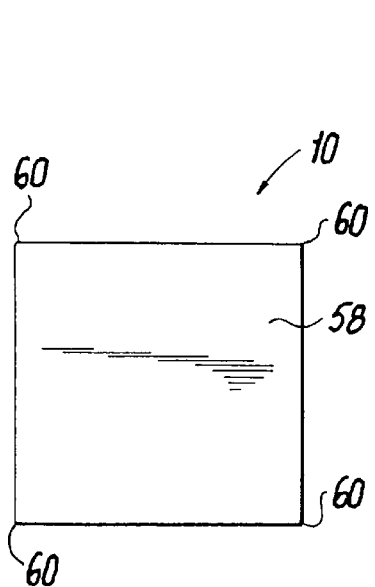
FIG. 3 illustrates a top plan view of the chip carrier of FIG. 1.
Figure 4:
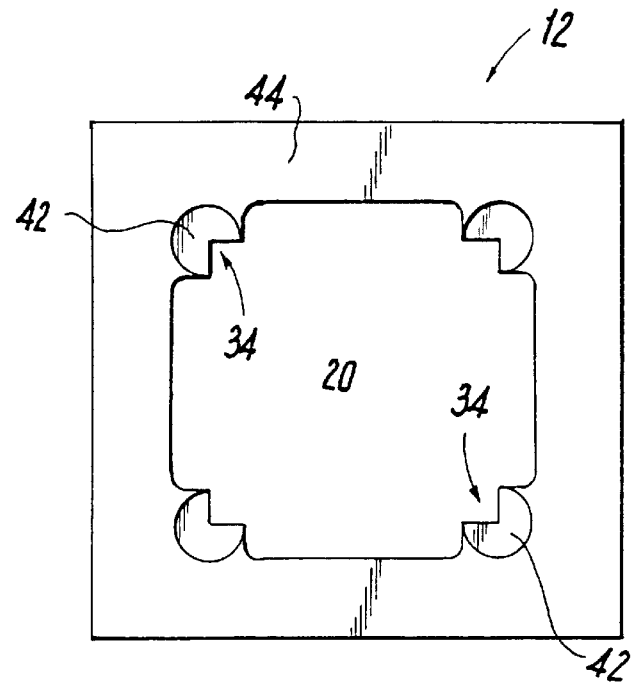
FIG. 4 illustrates a plan view of the chip carrier frame of FIG. 1.

The chip carrier frame 12 as represented by way of example, is essentially (but not necessarily) rectangular and planar and possesses a thickness 16 preferably identical with that of the chip carrier 10, and may be constituted of a transparent plastic material. Alternatively, the chip carrier may be of a thickness which is either thinner or greater than the thickness of the chip carrier frame. A central rectangular cut-out or opening 20 in the chip carrier frame 12, but which may be of a different shape in conformance with the chip carrier when the latter is not rectangular, has the four sides 22, 24, 26, 28 thereof dimensioned somewhat larger than the dimensions of the chip carrier 10, so as to form spaces 30 between each side of the chip carrier 10 and the opening 20 when the chip carrier is positioned in the chip carrier from, as shown in FIGS. 2 and 5 of the drawings. Towards each of the corners 32 of the opening 20 in the chip carrier frame 12, the opening becomes smaller so to form v-shaped, 90° angled corner portions 34 which are substantially the size of the chip carrier 10 so that the latter is closely positionable in the opening 20. This essentially smaller size of the corners 32, 34 of opening 20 so as to substantially conform with only a slight clearance with the peripheral dimensions of the chip carrier 10 enables a close fitting arrangement thereof in the chip carrier frame 12.

A spot-faced recess 40 is formed at each of the corners 32 of the opening 20 in the chip carrier frame 12 each being essentially of a generally circular configuration extending about v-shaped corner portions 34.

Figure 6A:
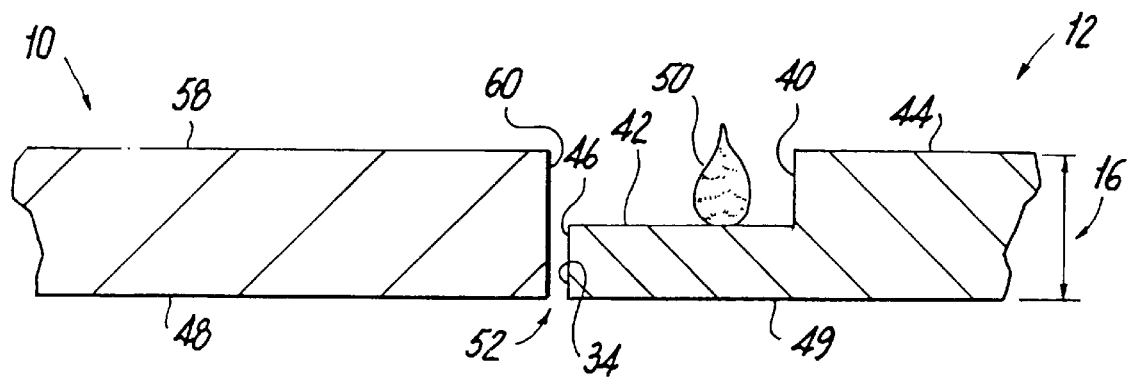
FIGS. 6a through 6c illustrate, on an enlarged scale, partial sectional views taken along line 6—6 in FIG. 5, representative of successive stages in the curing of an adhesive utilized for interconnecting the chip carrier and chip carrier frame as shown in FIGS. 2 and 5.
Figure 6B:
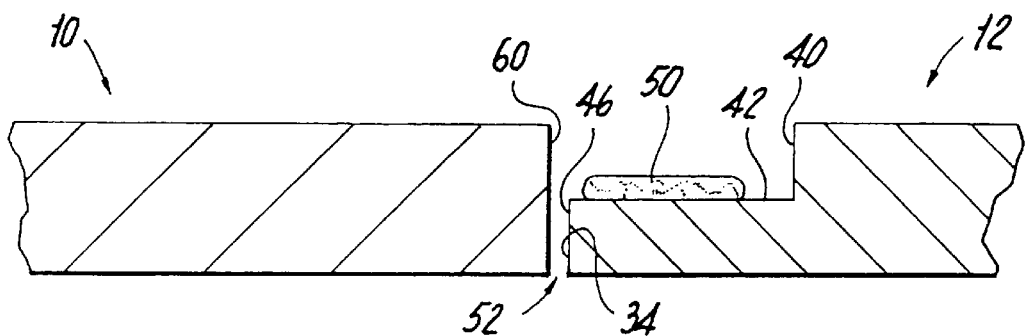
Figure 6C:
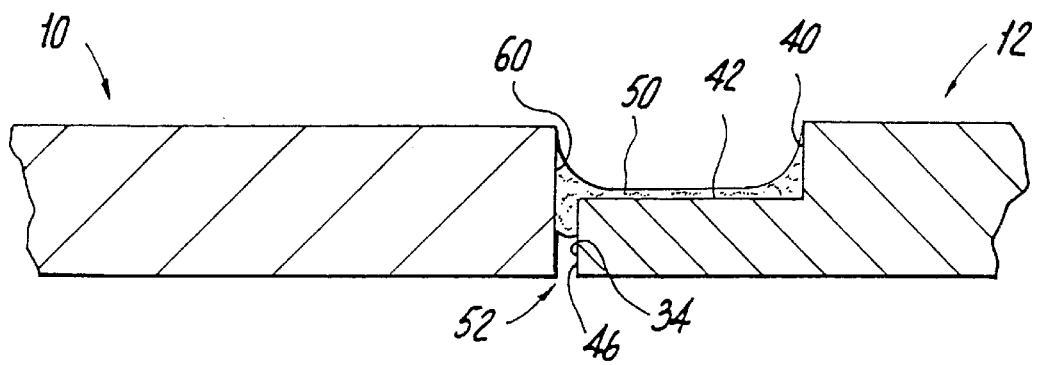

The essentially circular spot-faced recess at each corner 32, 34 forms land 42 which is downwardly offset from the upper surface 44 of the chip carrier frame 12 so as to provide a substantially pocket-like construction forming a land edge 46 above the bottom surfaces 48, 49 of, respectively, the chip carrier 10 and chip carrier frame 12 as clearly shown in FIGS. 6a through 6c of the drawings.

In order to fixedly position and fasten a chip carrier 10 within the opening 20 of an associated carrier frame 12, as shown in FIGS. 2 and 5 of the drawings, a drop of a suitable adhesive 50, preferably a curable thermal adhesive, is deposited on each land 46 on the respective corner portions 34 between the chip carrier 10 and the chip carrier frame 12, as shown in FIG. 6a. Thereafter, the assembly is subjected to a thermal treatment so as to cause the adhesive drop 50 to flow and expand across the land 42, as shown in FIG. 6b of the drawings, and thereby ultimately cover the upper surface 42 of the land and any narrow gap 52 which is present in the edge surfaced between the corners 60 of the chip carrier 10 and the corner portions 34 of the chip carrier frame 12, as shown in FIG. 6c. Upon the adhesive 50 being cured, the chip carrier 10 is adhesively retained in a fixed position relative to the chip carrier frame 12, whereby the lower or bottom surface 48 of the chip carrier 10 is coplanar with the lower or bottom surface 49 of the chip carrier 12, frame and the upper surface 58 of the chip carrier 10 is coextensive or coplanar with the upper surface 44 of the chip carrier frame 12. As can be ascertained, the cured adhesive is present only on the upper surface of the land 42 at each corner 32 of on the chip carrier frame 12 and, respectively, the vertical edge surfaces at each corner of the chip carrier 10. This will permit the entire upper and lower surfaces 48, 58 of the chip carrier 10 to remain exposed and available for equipping with chips for integrated circuits and/or applicable electric components, as is known in the technology. In effect, there is no waste of any surface areas or so-called "real estate" on the upper and lower surfaces of the chip carrier.

As indicated in FIG. 5 in a generally diagrammatic manner, the chip carrier frame 12 may be a portion of a series of adjoining similar frames which are interconnected or integrally arranged in either a series or extending in directions as an array so as to enable the simultaneous processing and shipping of a plurality of chip carriers 10 in a manner as described hereinabove.

While there has been shown and described what are considered to be preferred embodiments of the invention, it will, of course, be understood that various modifications and changes in form or detail could readily be made without departing from the spirit of the invention. It is, therefore, intended that the invention be not limited to the exact form and detail herein shown and described, nor to anything less than the whole of the invention herein disclosed as hereinafter claimed.

What is claimed is:

1. An arrangement for facilitating the processing and shipping of at least one laminate chip carrier; comprising:
   (a) a chip carrier frame having an opening formed therein;
   (b) at least one said chip carrier being inserted into said opening into coplanar alignment with said chip carrier frame;
   (c) said chip carrier frame opening being dimensioned such that peripherally spaced edge portions are closely proximate edge portions of said at least one chip carrier; and
   (d) an adhesive being interposed between said chip carrier and chip carrier frame edge portions so as to fixedly retain said at least one chip carrier in said chip carrier frame.

2. An arrangement as claimed in claim 1, wherein said at least one chip carrier has corners forming said edge portions, and said chip carrier frame has corner structures forming said frame edge portions, each of said frame edge portions having a recess forming a land for the depositing of said adhesive.

3. An arrangement as claimed in claim 2, wherein said recesses in said chip carrier frame comprise circular spot-faced recessed surfaces for the depositing of said adhesive.

4. An arrangement as claimed in claim 1, wherein said adhesive comprises a curable thermal adhesive composition.

5. An arrangement as claimed in claim 4, wherein said adhesive is flowable into spaces present between the chip carrier and chip carrier edge portions responsive to being heated and upon cooling forms a rigid mechanical connection between said at least one chip carrier and chip carrier frame.

6. An arrangement as claimed in claim 5, wherein said cured cooled adhesive is inhibited from flowing onto the surfaces of said at least one chip carrier by being confined between the edge portions of said at least one chip carrier and chip carrier frame.

7. An arrangement as claimed in claim 1, wherein said at least one chip carrier and said chip carrier frame have flat and coplanar configurations of identical thickness.

8. An arrangement as claimed in claim 2, wherein said at least one chip carrier is of an essentially square configuration.

9. An arrangement as claimed in claim 1, wherein a plurality of said chip carrier frames are integrally joined to form an array or strips of frames for the processing and shipping of a plurality of said chip carriers.

10. An arrangement as claimed in claim 9, wherein a plurality of said openings are formed in said array or strips of chip carrier frames, each said opening being adapted to fixedly retain respectively one of said chip carriers.

11. An arrangement as claimed in claim 1, wherein said chip carrier form is constituted of a plastic material.

12. An arrangement as claimed in claim 1, wherein said plastic material is substantially transparent.

13. A method of manufacturing an arrangement for facilitating the processing and shipping of at least one laminate chip carrier; comprising:
   (a) providing a chip carrier frame having an opening formed therein;
   (b) inserting at least one said chip carrier into said opening into coplanar alignment with said chip carrier frame;
   (c) said chip carrier frame opening being dimensioned such that peripherally spaced edge portions are closely proximate edge portions of said at least one chip carrier; and
   (d) interposing an adhesive between said chip carrier and chip carrier frame edge portions so as to fixedly retain said at least one chip carrier in said chip carrier frame.

14. A method as claimed in claim 13, wherein said at least one chip carrier has corners forming said edge portions, and said chip carrier frame has corner structures forming said frame edge portions, each of said frame edge portions having a recess forming a land for the depositing of said adhesive.

15. A method as claimed in claim 14, wherein said recesses in said chip carrier frame comprise circular spot-faced recessed surfaces for the depositing of said adhesive.

16. A method as claimed in claim 13, wherein said adhesive comprises a curable thermal adhesive composition.

17. A method as claimed in claim 16, wherein said adhesive is flowable into spaces present between the chip carrier and chip carrier edge portions responsive to being heated and upon cooling forms a rigid mechanical connection between said at least one chip carrier and chip carrier frame.

18. A method as claimed in claim 17, wherein said cured cooled adhesive is inhibited from flowing onto the surfaces of said at least one chip carrier by being confined between the edge portions of said at least one chip carrier and chip carrier frame.

19. A method as claimed in claim 13, wherein said at least one chip carrier and said chip carrier frame have flat and coplanar configurations of identical thickness.

20. A method as claimed in claim 14, wherein said at least one chip carrier is of an essentially square configuration.

21. A method as claimed in claim 13, wherein a plurality of said chip carrier frames are integrally joined to form an array or strips of frames for the processing and shipping of a plurality of said chip carriers.

22. A method as claimed in claim 21, wherein a plurality of said openings are formed in said array or strips of chip carrier frames, each said opening being adapted to fixedly retain respectively one of said chip carriers.

23. A method as claimed in claim 13, wherein said chip carrier form is constituted of a plastic material.

24. A method as claimed in claim 13, wherein said plastic material is substantially transparent.

* * * * *